United States Patent [19]

Schrey

[11] Patent Number: 5,781,397
[45] Date of Patent: Jul. 14, 1998

[54] METHOD FOR ADAPTING THE CONTROL OF AN ELECTROMAGNETIC ACTUATOR TO OPERATION-DICTATED CHANGES

[75] Inventor: Ekkehard Schrey, Aachen, Germany

[73] Assignee: FEV Motorentechnik GmbH & Co KG, Aachen, Germany

[21] Appl. No.: 694,423

[22] Filed: Aug. 12, 1996

[30] Foreign Application Priority Data

Aug. 26, 1995 [DE] Germany ............... 195 31 435.2

[51] Int. Cl.⁶ .............................. H01H 47/32
[52] U.S. Cl. .............................. 361/154; 361/187
[58] Field of Search ............... 361/152, 154, 361/170, 187, 194, 195

[56] References Cited

U.S. PATENT DOCUMENTS

| | | | |
|---|---|---|---|
| 3,725,747 | 4/1973 | Cowan | 361/154 |
| 4,720,761 | 1/1988 | Saletta et al. | 361/152 |
| 5,546,268 | 8/1996 | Harley et al. | 361/154 |

FOREIGN PATENT DOCUMENTS 3024109  9/1989  Germany.

*Primary Examiner*—Jeffrey A. Gaffin
*Assistant Examiner*—Michael J. Sherry
*Attorney, Agent, or Firm*—Spencer & Frank

[57] ABSTRACT

A method is provided for adapting a control for an electromagnetic actuator for actuating an adjusting device in a system, in particular for actuating a cylinder valve in a piston engine, to operation-dictated changes in the electromagnetic actuator. The electromagnetic actuator includes at least one electromagnet, a restoring spring, an armature operately coupled to the cylinder valve and disposed for movement counter to the restoring spring. The electromagnet is energized, during an idling phase of the engine, with a current having a path deviating from a normal current in a normal mode of operation. Portions of a course over time of current through the electromagnet are detected. The detected course of current is compared with a predetermined curve. The control for the electromagnet for the normal mode is adapted if there are deviations between the detected course of the current and the predetermined curve.

4 Claims, 3 Drawing Sheets

METHOD FOR ADAPTING THE CONTROL OF AN ELECTROMAGNETIC ACTUATOR TO OPERATION-DICTATED CHANGES

CROSS-REFERENCE TO RELATED APPLICATIONS

This application claims the right of priority of application DE 195 31 435.2 filed in Germany on Aug. 26, 1995, the disclosure of which is incorporated herein.

BACKGROUND OF THE INVENTION

The invention relates to an electromagnetic actuator having an electromagnet and an armature movable by a restoring spring counter to the force of another restoring spring for actuating an adjusting device for a system, and in particular, the invention relates to such an electromagnetic actuator for actuating a cylinder valve in a piston-type internal combustion engine. The attainment of the requisite timing accuracy of such an actuator is a substantial problem.

If such electromagnetic actuators are used, for instance, to control the cylinder valves of piston engines, where each cylinder valve is provided with its own actuator for effecting an adaptable control for the outflow and inflow of an operating medium, then a possibility exists of optimally affecting the working process in accordance with whatever aspects are required. The course of the control has a major influence on various parameters such as the states of the operating medium in the inlet region, in the work chamber and in the outlet region, and on the events in the work chamber itself. Since such piston engines operate unsteadily under highly variable operating conditions, a suitably variable control of the cylinder valves is desirable. The use of electromagnetic actuators for cylinder valves is known for instance from German Patent 3,024,109.

Accurate control of the times, however, is made more difficult by production-dictated tolerances and even more by wear phenomena occurring over the course of operation, yet also by various operating states, such as changing load demands and operating frequencies, since these external factors can affect time-relevant parameters of the system comprising the actuator and the cylinder valve.

If such electromagnetic actuators are used in mass-production vehicle engines, then over the long term, satisfactory function of the actuator with the requisite timing accuracy must be assured, without requiring manual readjustment of the actuator or its triggering.

For the normal mode of operation, the system, such as a piston engine, is assigned a control device, which detects the various operating data of the system, including the load demand, and from them then derives the requisite control signals for actuating the actuator. Changes caused by wear, external temperature factors, and so forth, however, can mean that the predetermined time-dependent signals do not match the actual reaction times of the electromagnetic actuator to be energized, or are not converted in such a way that they correspond to the desired control state.

SUMMARY OF THE INVENTION

An object of the invention is to provide a method for adaptation that can be carried out during or at least in combination with the operation of the applicable system in order to avoid complicated adaptations of the control by a diagnostic process.

The above and other objects are accomplished in accordance with the invention by the provision of a method for adapting a control for an electromagnetic actuator for actuating an adjusting device in a system to operation-dictated changes in the electromagnetic actuator, the electromagnetic actuator including at least one electromagnet, a restoring spring, an armature operately coupled to the adjusting device and disposed for movement counter to the restoring spring, the method comprising the steps of: energizing the electromagnet, during an idling phase of the system, with a current having a path deviating from a normal current in a normal mode of operation; detecting at least portions of a course over time of current through the electromagnet; comparing the detected course of current with a predetermined curve; and adapting the control for the normal mode of operation of the electromagnet if there are deviations between the detected course of current and the predetermined curve.

In a specific embodiment of the invention, the system is a piston engine and the adjusting device comprises a cylinder valve that is operatively coupled to the armature.

In a "normal mode" of such an electromagnetic actuator, for instance an electromagnetic actuator for actuating a cylinder valve in a piston engine, the imposition of current on whichever electromagnet is the "capturing" magnet is controlled such that the armature is just caught at the pole face of the electromagnet. Not only does this reduce the expenditure of energy, but disadvantageous factors during the capturing process, such as the collision of the armature with the pole face, are avoided. However, operating in such a mode means that because of the reduced input of energy during the capturing phase, the imposition of current on the capturing electromagnet is necessarily reduced, with the consequence that the course over time of the current during the capturing phase undergoes no significant changes once the armature actually does come into contact with the pole face. From this it can be seen that the requisite operating conditions for reliable operation are affected especially by timing parameters, and also by energy parameters, in particular current and voltage, whose operation-dictated changes must be corrected and compensated for in the controller.

If now, as proposed in accordance with the invention, the capturing electromagnet is energized during a so-called "idling phase" (i.e. a no-load running phase of the system with a current course that differs from the normal mode, in particular a higher current, then the arrival of the armature at the pole face results in a significant drop in the current intensity. This creates a possibility for detecting the instant of arrival and hence a possibility of detecting the actual actuation time of a valve, which time is composed of the so-called sticking time and the motion time. Because of the imposition of an increased current, although there is only a slight influence on the motion time, a significant change occurs in the course over time of the current at the instant the armature arrives at the pole face of the electromagnet, and this can then be evaluated as a signal. If the actually detected actuation time of the particular valve is then compared with a predetermined desired time, then when deviations occur in one direction or the other, or in other words if the valve reaches its opening or closing position too early or the valve reaches its opening or closing position too late, the possibility arises of acting, via a suitable control signal, on the control of the system and effecting a shift in the instant of energization of the capturing electromagnet in one direction or the other, so that the control can be adapted to the actual conditions, that is to include operation-dictated changes in the function of the actuator.

Instead of energizing whichever electromagnet is the capturing magnet with a higher current, it is also possible in another embodiment of the invention to energize the capturing electromagnet with a progressively lesser current during idling phases of the system to detect an armature failure, and to increase the current course for the normal mode by a pre-determinable amount relative to the current course detected in the electromagnet. The term "armature failure" here means that the electromagnet is acted upon by current at a level that just precisely no longer suffices to capture the armature, so that the armature just barely no longer comes to rest on the pole face. If the current course is detected over the entire length of time or even only a portion of the length of time, or if only the current level for the portion of time within which the armature should come to rest is detected, and if from that a corresponding adjusting signal is derived, then by adding a predetermined amount to increase the current, for instance between 3 and 10% or more, depending on conditions, the control can be corrected appropriately with respect to the current course for the normal mode, so that the operating conditions for reliable operation can then be adhered to.

As a rule it is unnecessary to make such adaptations on an ongoing basis during the "normal mode" of a unit. It suffices if monitoring of the actual state of the actuation time of the electromagnetic actuator is carried out during operating phases of the unit in which the "normal" operating mode of the unit is unimpaired. In a piston engine, for instance, this can be done when the engine is in an overrunning or revving mode and in general whenever no power output is demanded of the system, that is, for instance, the method can be done as well either during actual idling phases or when the ignition is turned off to shut down the engine, but the engine is running-down, that is still making a few revolutions because of the flywheel effect. Another possibility exists of actuating the electromagnets with the predetermined higher current during stoppage of the engine regardless of the rotation of the crankshaft and detecting the various current curves and comparing them with the data stored in a memory in the control.

The method of the invention will be described below in further detail in conjunction with the accompanying drawings.

DETAILED DESCRIPTION OF THE PREFERRED EMBODIMENTS

Figure 1:
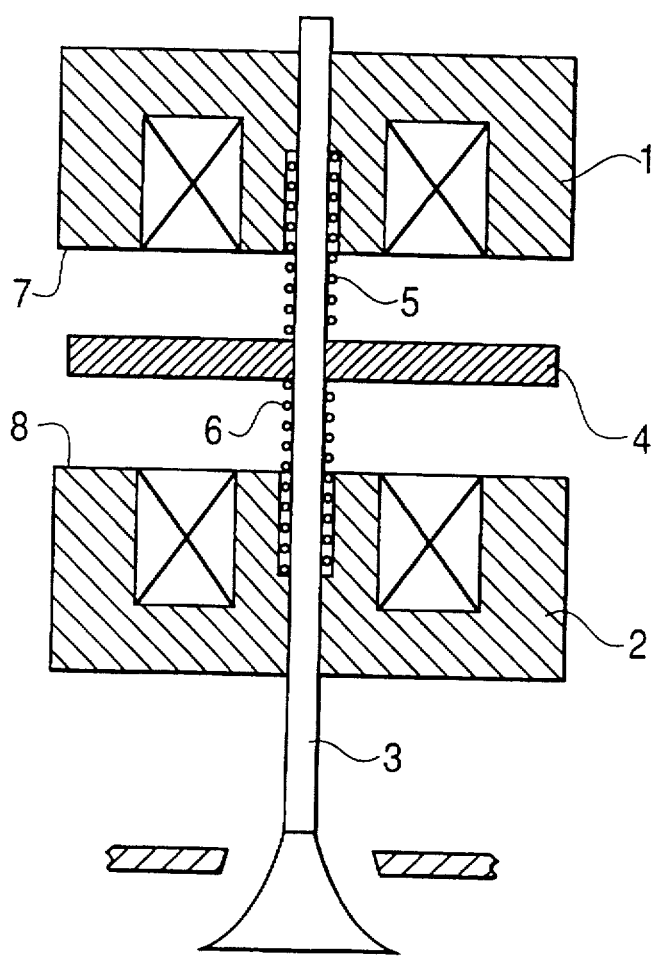
FIG. 1 is a cross section of an electromagnetic actuator for actuating a cylinder valve with which the method of the invention may be practiced.

The electromagnetic actuator schematically shown in FIG. 1 for actuating a cylinder valve for a piston engine substantially comprises an electromagnet 1 having a pole face 7 and which acts as a closing magnet, an electromagnet 2 having a pole face 8 and which acts as an opening magnet, and a cylinder valve stem 3, which is connected to an armature 4 that is movable back and forth between the two electromagnets 1 and 2 counter to the force of respective restoring springs 5 and 6. Depending on the energizing of the electromagnets, armature 4 comes to rest in a closing position on pole face 7 of closing electromagnet 1 or in an opening position on pole face 8 of electromagnet 2.

If, during operation, the cylinder valve is in the closing position, for instance, that is, if armature 4 is resting on pole face 7 of electromagnet 1, then the opening of the applicable cylinder valve is brought about by first turning off the holding current to electromagnet 1, so that under the exertion of force by restoring spring 5, armature 4 moves toward pole face 8 of electromagnet 2. Depending on the magnitude of the residual field at electromagnet 1, the instant of turnoff of the holding current at electromagnet 1 is not identical with the onset of motion of armature 4. Because of the so-called sticking time, the motion of armature 4 begins with some time lag compared with the turnoff time of the holding current.

Under the influence of the exertion of force by restoring spring 5, armature 4 swings through the middle position dictated by the equilibrium of the force exerted by the two restoring springs 5 and 6, and at a corresponding instant the current is turned on at the capturing, opening electromagnet 2. The resulting magnetic field of electromagnet 2 exerts a force to counteract the restoring force exerted by restoring spring 6 and to cause armature 4 reliably to contact pole face 8 of electromagnet 2, so that the cylinder valve via stem 3 can be kept open over the opening time specified by the controller. To close the cylinder valve, the above-described process takes place in reverse order.

Figure 2A:
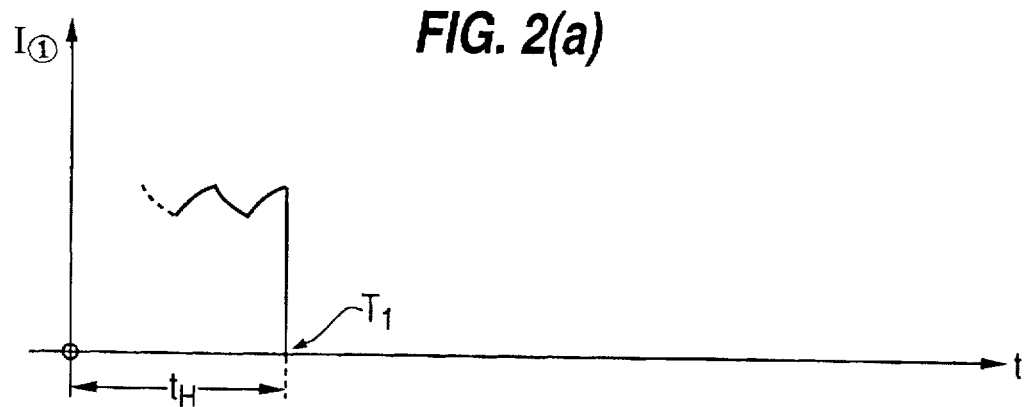
FIG. 2 is a diagram showing graphs a) and b) of the current course over time of two coils, respectively, and a graph c) showing the stroke path of the armature as a function of time.
Figure 2B:
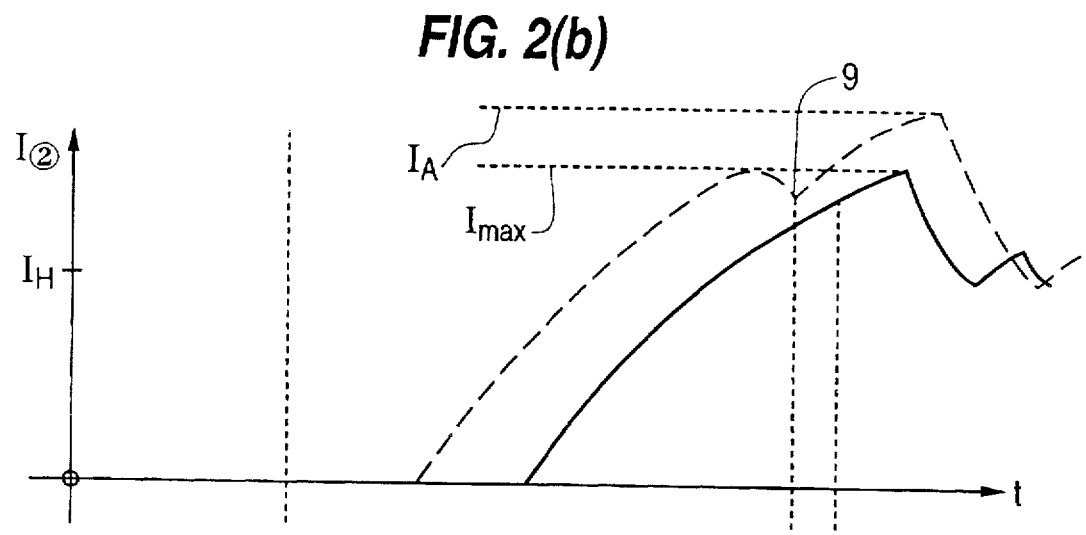
Figure 2C:
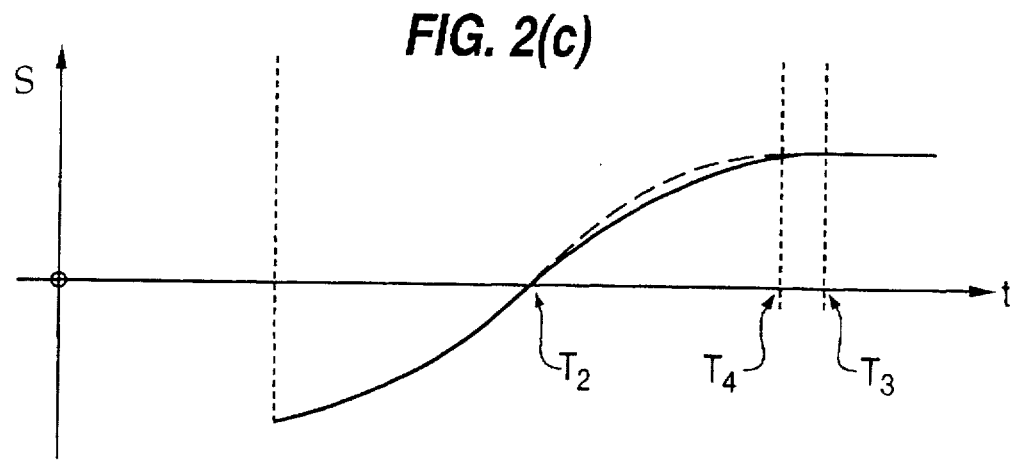

FIG. 2 shows in associated graphs a) to c), respectively, for the opening process described above, the course over time of the current at closing electromagnet 1, the course over time of the current at opening electromagnet 2, and the stroke path of armature 4. In graph a) in FIG. 1, the course of the current at closing electromagnet 1 is shown during a holding phase $t_H$. The current here is clocked at a low level, so that armature 4 is just barely held on pole face 7 of closing magnet 1. In order to bring about the opening operation as described above, the current is turned off at time $T_1$, making electromagnet 1 currentless.

If the assumption is that electromagnet 1 has no "sticking time", then as shown in graph c) in FIG. 2, armature 4 is set immediately into motion under the influence of the force exerted by restoring spring 5.

Approximately at time $T_2$, at which armature 4 passes through the position of repose between the two pole faces 7 and 8, the current is turned on at capturing electromagnet 2 so that a magnetic field builds up there with adequate intensity to enable reliable capturing of armature 4 on pole face 8. The current rises in an exponential function to a maximum value. At time $T_3$, armature 4 comes to rest on pole face 8. The controller, however, is designed such that the current still rises for a certain period of time past the expected time $T_3$, in order to assure reliable capturing of the armature. Next, the current is then regulated back from the value $I_{max}$ intended for the capturing operation to the lower value of $I_H$.

For performing the method of the invention, the capturing opening electromagnet 2 is now triggered with a current having an upper limit $I_A$ markedly above the value $I_{max}$ of the normal mode. As a consequence, because of the change in inductance of the magnetic field of the capturing electromagnet, a voltage that is dependent on the speed of motion of the armature is induced and causes a drop in the current. Because of the major input of energy, the armature strikes the pole face with high speed, so that the speed changes suddenly, thus making a marked "kink" 9 apparent in the course of the current over time at the instant of impact of the armature. Such a significant deviation in the course of the current over time can then be utilized for purposes of evaluation and for generating an adjusting signal.

It is accepted into the bargain here that because of the higher current imposition on the coil of the capturing electromagnet, a higher energy input into the approaching armature 4 also takes place, so that the armature, as shown in dashed lines in FIG. 2, graphs b) and c), comes into contact somewhat earlier than in the normal mode.

This slight deviation from the normal mode can, since a desired curve is specified anyway for the normal mode, be compensated for in combination with the generation of a possible adjusting signal.

If the comparison with a predetermined desired curve now shows that from operation-dictated changes the actual motion times do not match the predetermined motion times, then this can be corrected and compensated for by suitable adaptation of the control, either by shifting the onset of energizing of the applicable electromagnet or by varying the level of current for holding and/or capturing the armature.

Figure 3:
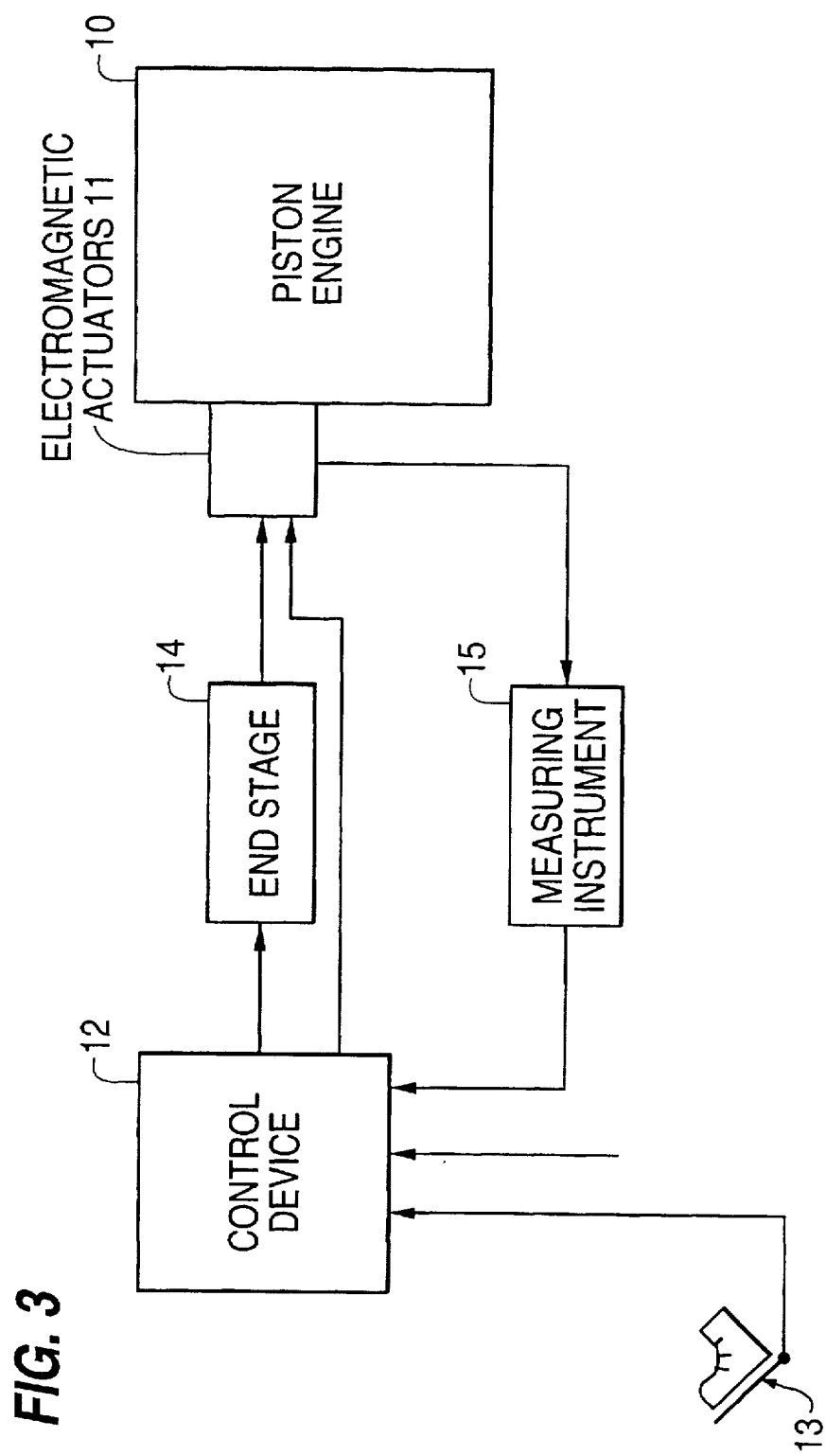
FIG. 3 is a block circuit diagram for a correction controller for implementing the method according to the invention.

FIG. 3 shows a block circuit diagram of an apparatus for performing the method of the invention. A piston engine 10, having cylinder valves (not separately shown) actuated by electromagnetic actuators 11, is connected to a control device 12, by way of which the cylinder valves can be triggered in accordance with the load demands in operation. The corresponding control commands are given for instance via a gas pedal 13. Additional corrections of the control commands can also be varied by way of other operating parameters detected at the piston engine, such as a change in the opening or closing times of the cylinder valves, in order to enable triggering of the degree of filling of the cylinders, the residual gas content or the air ratio thereof by means of a suitable control of the cylinder valves as a function of operation.

A "normal program" is specified for the control device 12 so that the parameters predetermined by the mass to be moved, the spring forces, the sticking times, friction, etc., will also be taken into account for the motion time of the cylinder valves.

Now, to enable monitoring the proper function of the various cylinder valves in accordance with the method of the invention, a higher current is specified for electromagnetic actuators 11 via control device 12 and an end stage 14, during an "idling phase", or in other words during a no-load running mode which includes actual idling, the overrunning revving mode, and shutdown of the engine after the ignition is turned off. Via a suitable measuring instrument 15, the resultant course of the current, described in conjunction with FIG. 2, and the thus-ascertained instant of arrival of the armature at the capturing electromagnet can be detected relative to the instant of turnoff of the current at the holding electromagnet, so that by a comparison of the data specified for the normal mode, a suitable automatic adaptation of the "control program" can be performed in the control device 12 if there are deviations.

Proceeding in this way can now be performed as a separate step during the shutdown of the engine, in the context of an engine diagnosis. However, the particular advantage of the method of the invention is that monitoring of the actual reaction times of the applicable electromagnetic actuator can be done automatically on an ongoing basis in conjunction with operation, for instance upon shutdown of the piston engine while the engine is still at operating temperature. As indicated above, testing and adaptation, given suitable arrangement of the control device 12, is also possible during operation, namely always in so-called "idling phases (no-load running phase)", such as in actual idling in the overrunning (engine revving) mode, shutdown or similar operating states.

For the sake of evaluating the desired value/actual value comparison, it is unnecessary to detect and compare the overall course of the current curve. It suffices to detect the turnoff time $T_1$, at the holding magnet, and then the "kink" 9 in the current curve, ascertained via the time $T_4$ at the imposed elevated current.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A method for adapting a control for an electromagnetic actuator for actuating a cylinder valve in a piston engine to operation-dictated changes in the electromagnetic actuator, the electromagnetic actuator including at least one electromagnet, at least one restoring spring, an armature operately coupled to the cylinder valve and disposed for movement counter to the restoring spring, the method comprising the steps of:

energizing the electromagnet, during a no-load running phase of the engine, with a current having a course deviating from a normal current in a normal mode of operation;

detecting at least portions of a course over time of current through the electromagnet;

comparing the detected course over time of the current with a predetermined curve; and adapting the control for the normal mode of operation of the electromagnet if there are deviations between the detected course over time of the current and the predetermined curve.

2. The method of claim 1, wherein the energizing step includes energizing the electromagnet during the no-load running phases of the engine with a higher current than the current in the normal mode.

3. The method of claim 1, wherein:

the energizing step includes energizing the electromagnet during the no-load running phases of the engine with a progressively lesser current for detecting armature failure; and the adapting step includes increasing the normal current by a predeterminable amount relative to the detected current course.

4. The method of claim 1, wherein the energizing step includes energizing the electromagnet with an increased current during a running-down phase upon shutdown of the engine.

* * * * *